(12) United States Patent
Tanaka

(10) Patent No.: US 6,929,755 B2
(45) Date of Patent: Aug. 16, 2005

(54) METHOD OF AND APPARATUS FOR CHEMICAL MECHANICAL POLISHING AND SLURRY SUPPLYING DEVICE

(75) Inventor: Kazuhiro Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 332 days.

(21) Appl. No.: 09/965,803

(22) Filed: Oct. 1, 2001

(65) Prior Publication Data

US 2002/0195424 A1 Dec. 26, 2002

(30) Foreign Application Priority Data

Jun. 21, 2001 (JP) ........................................ 2001-187700

(51) Int. Cl.⁷ .......................... B44C 1/22; C03C 15/00; C03C 25/68; C23F 1/00; H01L 21/306
(52) U.S. Cl. ..................................... 216/89; 156/345.13
(58) Field of Search .............................. 216/52, 88, 89, 216/93, 38; 438/692, 693; 156/345.12, 345.13, 345.14

(56) References Cited

U.S. PATENT DOCUMENTS 5,531,861 A * 7/1996 Yu et al. ..................... 438/693
5,791,970 A * 8/1998 Yueh ............................. 451/8
5,865,665 A   2/1999 Yueh
6,117,779 A * 9/2000 Shelton et al. .............. 438/692

FOREIGN PATENT DOCUMENTS

| JP | 7-40246 A | 2/1995 |
| JP | 2000-71172 A | 3/2000 |
| JP | 2000-190223 A | 7/2000 |
| JP | 2000-308967 A | 11/2000 |

* cited by examiner

Primary Examiner—Parviz Hassenzadeh
Assistant Examiner—Roberts Culbert
(74) Attorney, Agent, or Firm—Leydig, Voit & Mayer, Ltd.

(57) ABSTRACT

The distribution and size distribution of polishing particles contained in a slurry to be supplied to a polishing unit are measured by a measuring machine. Polishing speed with respect to a wafer is controlled to be constant by controlling a physical quantity such as the rotation speed of a polishing surface plate, the rotation speed of a polishing head or the pressurizing force of the polishing head based on the measurement result.

4 Claims, 10 Drawing Sheets

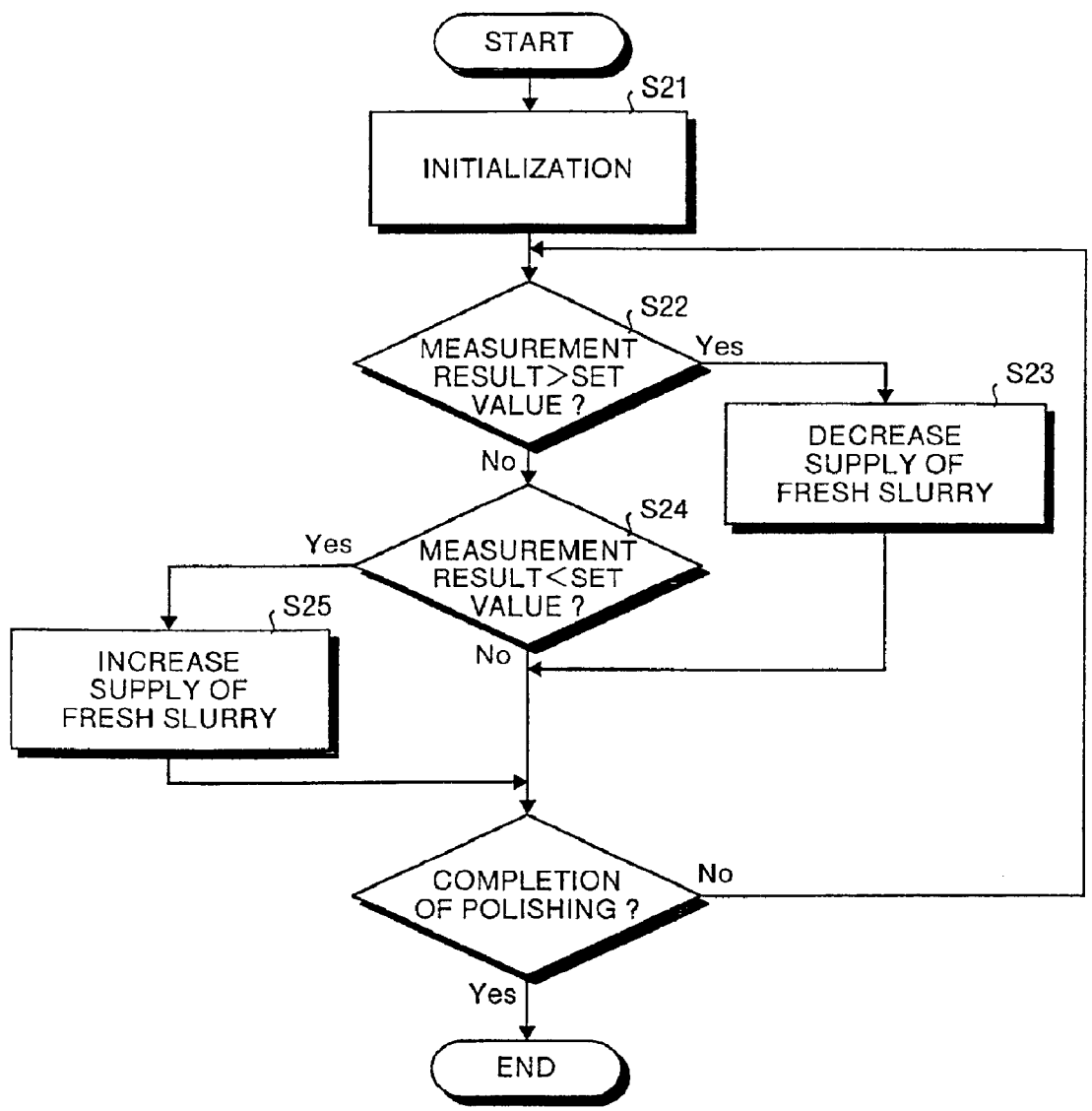

METHOD OF AND APPARATUS FOR CHEMICAL MECHANICAL POLISHING AND SLURRY SUPPLYING DEVICE

FIELD OF THE INVENTION

The present invention relates to a method of and apparatus for chemical mechanical polishing, and a slurry supplying device, which are suitable for fabrication of a semiconductor device.

BACKGROUND OF THE INVENTION

Flattening a film is an absolutely necessary technique in the process of fabrication of a semiconductor device. In such a situation, there has been often used a chemical mechanical polishing apparatus. In the chemical mechanical polishing apparatus, the surface of an object to be polished such as a wafer is polished by the use of a chemical polishing material containing therein polishing particles, referred to as a slurry. In the chemical mechanical polishing apparatus of this type, in order to prevent any adverse influence by a by-product generated during polishing or a change in chemical composition of the slurry per se, the slurry is continuously supplied during the polishing.

The polishing particles contained in the slurry are present in a polishing liquid as the polishing material, and they are not always dispersed in the polishing liquid in a uniform manner. Consequently, it is difficult to maintain the distribution of the polishing particles or the size distribution of the polishing particles in a constant state all the time. If the distribution of the polishing particles or the size distribution of the polishing particles is different, a change in polishing speed with respect to the object to be polished becomes marked. As a result, the difference in distribution of the polishing particles or size distribution of the polishing particles may considerably influence machining quality such as the uniformity or flatness of polishing. In particular, as shown in FIG. 10AF and FIG. 10B, the size distribution of the polishing particles or the mixing ratio of the polishing particles to the polishing liquid is usually dependent on slurry manufacturers. Therefore, the change of a manufacturer markedly influences the quality of machining. Moreover, even in the case of one and the same manufacturer, the distribution of the polishing particles or the size distribution of the polishing particles frequently varies depending on a fabrication lot. Furthermore, even in the case of one and the same fabrication lot, the content of the polishing particles contained in the polishing liquid tends to become low in the former half of slurry supplying. Thereafter, although the slurry may be temporarily supplied in an appropriate mixing ratio, the content of the polishing particles contained in the polishing liquid becomes higher in the latter half of the slurry supplying and thereafter. Additionally, there have been recently proposed a variety of techniques so that the slurry, once used in polishing, is recovered for recycling, thereby making the above-described problems more complicated. In other words, the recovered slurry for recycling is recycled after the recovered slurry is mixed with a non-used fresh slurry to adjust the components of the slurry. Therefore, the difference in distribution of the polishing particles or size distribution of the polishing particles becomes greater, so that its adverse influence on the quality of machining cannot be negligible.

SUMMARY OF THE INVENTION

It is an object of the present invention to provide a method of and apparatus for chemical mechanical polishing, and a slurry supplying device in which the quality of polishing machining can be enhanced.

The method of chemical mechanical polishing according to one aspect of the present invention comprises following steps. That is, the steps of supplying a slurry; and polishing an object with particles contained in the slurry. The polishing step includes a step of controlling a physical quantity, which is a determinant factor of a polishing speed with respect to the object, based on information on the particles contained in the slurry.

The method of chemical mechanical polishing according to another aspect of the present invention comprises following steps. That is, the steps of supplying a slurry; and polishing an object with particles contained in the slurry. The polishing step including a step of controlling a polishing time based on information on the particles contained in the slurry.

The apparatus for chemical mechanical polishing according to still another aspect of the present invention comprises a first slurry supplying unit which supplies a first slurry; a second slurry supplying unit which supplies a second slurry; a polishing unit which receives the first slurry from the first slurry supplying unit and the second slurry from the second slurry supplying unit and polishes an object with particles contained in the slurry; and a control unit which controls supply of slurry from the first slurry supplying unit and the second slurry supplying unit to the polishing unit according to a polishing speed with respect to the object to be polished.

The apparatus for chemical mechanical polishing according to still another aspect of the present invention comprises a first slurry supplying unit which supplies a first slurry; a second slurry supplying unit which supplies a second slurry; a polishing unit which receives the first slurry from the first slurry supplying unit and the second slurry from the second slurry supplying unit and polishes an object with particles contained in the slurry; and a control unit which controls supply of slurry from the first slurry supplying unit and the second slurry supplying unit to the polishing unit according to the type or quality of the surface film of the object.

The apparatus for chemical mechanical polishing according to still another aspect of the present invention comprises a slurry supplying unit; a polishing unit which receives the slurry from the slurry supplying unit and polishes an object with particles contained in the slurry; a polishing particle information acquiring unit which acquires information on the particles contained in the slurry to be supplied to the polishing unit; and a polishing and driving controlling unit which controls a physical quantity, which is a determinant factor of a polishing speed with respect to the object, based on the information on the particles acquired by the polishing particle information acquiring unit.

The apparatus for chemical mechanical polishing according to still another aspect of the present invention comprises a slurry supplying unit; a polishing unit which receives the slurry from the slurry supplying unit and polishes an object with particles contained in the slurry; a polishing particle information acquiring unit which acquires information on the particles contained in the slurry to be supplied to the polishing unit; and a polishing and driving controlling unit which controls a polishing time based on the information on the particles acquired by the polishing particle information acquiring unit.

The apparatus for chemical mechanical polishing according to still another aspect of the present invention comprises a first slurry supplying unit which supplies a first slurry; a second slurry supplying unit which supplies a second slurry;

a mixture slurry supplying unit which receives and mixes the first slurry supplied by the first slurry supplying unit with the second slurry supplied by the second slurry supplying unit; a polishing unit which receives the mixture of slurries from the mixture slurry supplying unit and polishes an object with particles contained mixture of slurries; a polishing speed detecting unit which detects a polishing speed with respect to the object; and a mixture ratio controlling unit which controls the first slurry supplying unit and the second slurry supplying unit so as to control a ratio of the quantities of the first slurry and the second slurry, when supplying them to the mixture slurry supplying unit for mixing, based on the polishing speed detected by the polishing speed detecting unit.

The apparatus for chemical mechanical polishing according to still another aspect of the present invention comprises a first slurry supplying unit which supplies a first slurry; a second slurry supplying unit which supplies a second slurry; a mixture slurry supplying unit which receives and mixes the first slurry supplied by the first slurry supplying unit with the second slurry supplied by the second slurry supplying unit; a polishing unit which receives the mixture of slurries from the mixture slurry supplying unit and polishes an object with particles contained mixture of slurries; a polishing particle information acquiring unit which acquires information on the particles contained in the mixture slurry to be supplied to the polishing unit; and a mixture ratio controlling unit which controls the first slurry supplying unit and the second slurry supplying unit so as to control a ratio of the quantities of the first slurry and the second slurry, when supplying them to the mixture slurry supplying unit for mixing, based on the information on the particles acquired by the polishing particle information acquiring unit.

Other objects and features of this invention will become apparent from the following description with reference to the accompanying drawings.

BRIEF DESCRIPTION OF THE DRAWINGS

FIG. 6 is a flowchart illustrating the control content which is implemented during polishing machining by a valve controller in the fourth preferred embodiment;

DESCRIPTION OF THE PREFERRED EMBODIMENTS

Embodiments of the method of and the apparatus for chemical mechanical polishing, and the slurry supplying device according to the present invention will be explained in detail below while referring to the accompanying drawings.

Figure 1:
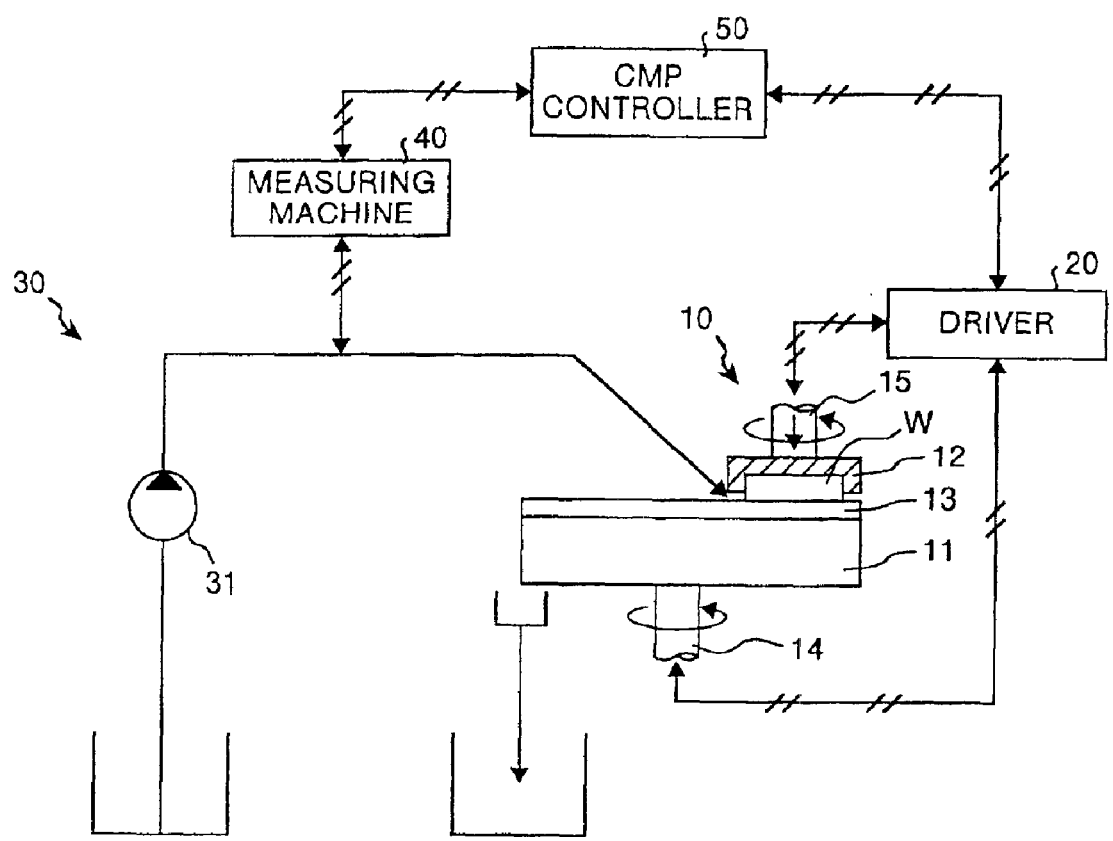
FIG. 1 is a block diagram illustrating the configuration of a chemical mechanical polishing apparatus in a first preferred embodiment according to the present invention.

FIG. 1 is a block diagram illustrating the configuration of a chemical mechanical polishing apparatus according to the first embodiment of the present invention. The chemical mechanical polishing apparatus illustrated in FIG. 1 is adapted to subject a wafer W as an object to be polished to polishing machining in the process of fabrication of a semiconductor device, and its polishing unit 10 includes a polishing surface plate 11 and a polishing head 12.

The polishing surface plate 11 has a polishing pad 13 laid at the upper surface thereof, is formed into a disk-like shape, and can be rotated on the axis of a rotary shaft 14 disposed along a vertical direction. The polishing head 12 is adapted to press the wafer W placed at the upper surface of the polishing surface plate 11 against the upper surface of the polishing surface plate 11, and therefore, is formed into a disk having a recess, which is formed at the lower surface of the polishing head 12 in order to contain the wafer W therein. The polishing head 12 can be rotated on the axis of a rotary shaft 15 disposed along a vertical direction and can be moved along the vertical direction in the state in which the recess faces to the upper surface of the polishing surface plate 11.

Each of the polishing surface plate 11 and the polishing head 12 is operated in response to a drive signal output from a driver 20. Namely, upon receipt of a rotation speed signal from the driver 20, the polishing surface plate 11 is rotated on the axis of the rotary shaft 14 at a rotation speed according to the rotation speed signal. Upon receipt of a rotation speed signal from the driver 20, the polishing head 12 is rotated on the axis of the rotary shaft 15 at a rotation speed according to the rotation speed signal; and further, upon receipt of a pressurization signal from the driver 20, the polishing head 12 is appropriately moved along the vertical direction in such a manner as to act a pressure according to the pressurization signal on the wafer W held between the upper surface of the polishing surface plate 11 and the polishing head 12.

Furthermore, the above-described chemical mechanical polishing apparatus is provided with a slurry supplying device 30. The slurry supplying device 30 is adapted to supply a slurry to a slide-contact portion between the polishing pad 13 and the wafer W at the upper surface of the polishing surface plate 11. In the slurry supplying device 30, a measuring machine 40 is disposed on the way to the polishing unit 10. The measuring machine 40 measures the distribution and/or size distribution of polishing particles contained in the passing slurry, and then, gives the measurement result to a CMP controller 50. There are a variety of the measuring machines 40 of this type: for example, the slurry is irradiated with a laser beam from a laser beam source, the beam scattering from the polishing particles is detected by an optical detector, and then, the distribution or size distribution of the polishing particles is measured based on a signal indicating the intensity of the scattering beam, output from the optical detector. The CMP controller 50 is adapted to give a control signal to the above-described driver 20 based on the measurement result sent from the measuring machine 40. The CMP controller 50 previously stores therein the correlation between the rotation speed and polishing speed of the polishing surface plate 11, the correlation between the rotation speed and polishing speed of the polishing head 12 and the correlation between the pressurizing force and polishing speed of the polishing head 12 according to the distribution or size distribution of the polishing particles.

Figure 2:
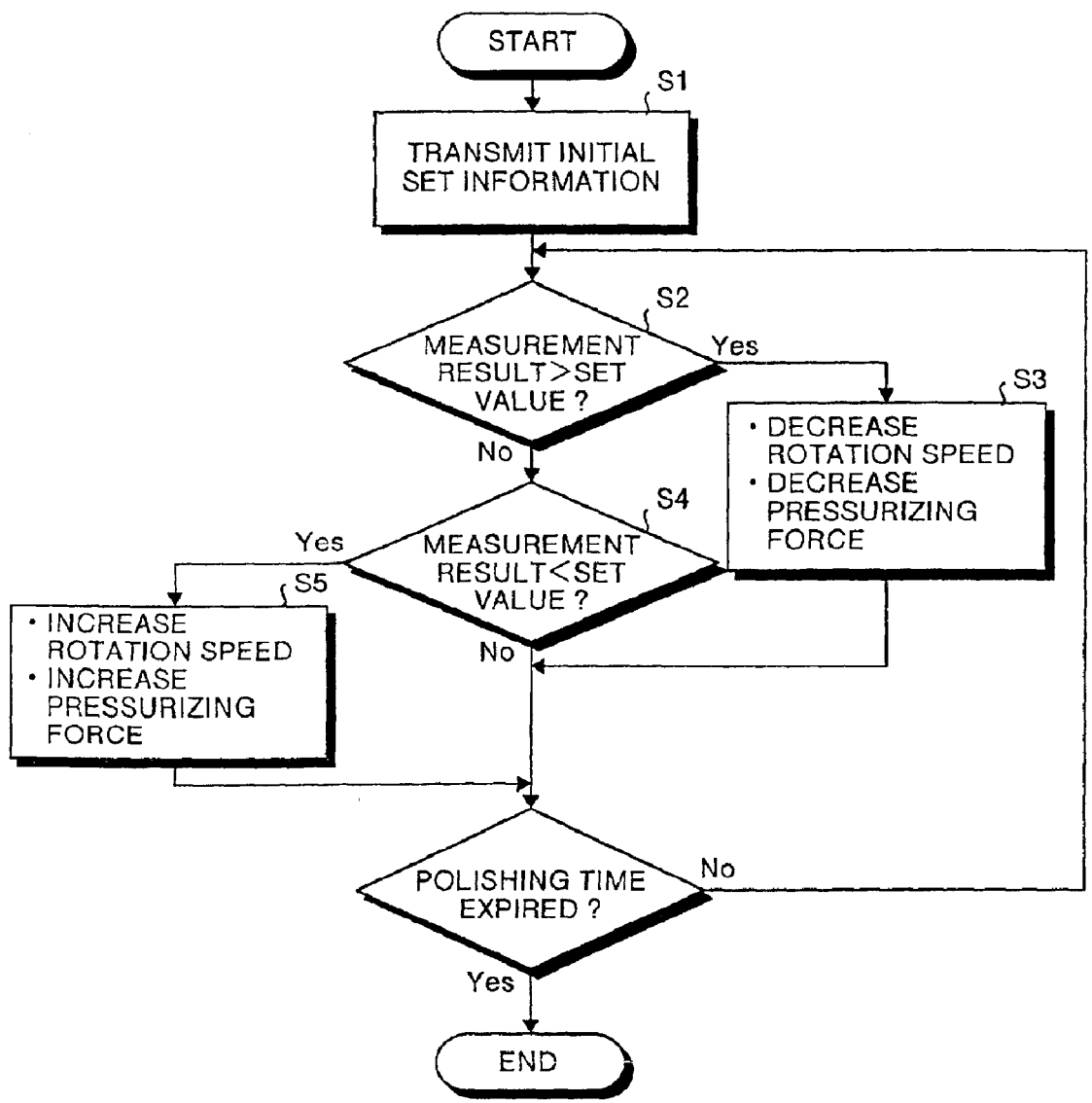
FIG. 2 is a flowchart illustrating the control content which is implemented during polishing machining by a CMP controller in the chemical mechanical polishing apparatus illustrated in FIG. 1.

FIG. 2 is a flowchart illustrating the control content which is implemented during polishing machining by the CMP controller 50 in the chemical mechanical polishing apparatus illustrated in FIG. 1. Referring to FIG. 2, explanation will be made below on the operation of the chemical mechanical polishing apparatus.

First, the CMP controller 50 sends initial set information, which has been previously set, to the driver 20 (step S1). This initial set information is information indicative of a physical quantity such as the rotation speed of the polishing surface plate 11, the rotation speed of the polishing head 12, the pressurizing force of the polishing head 12 or a polishing time in which uniform and flat polishing machining can be applied in the case of use of, for example, a slurry having the standard distribution and size distribution of the polishing particles. Consequently, the driver 20 outputs a drive signal upon receipt of the initial set information, so that the polishing surface plate 11 and the polishing head 12 are driven in accordance with the initial set information. At the same time, a pump 31 disposed in the slurry supplying device 30 is driven to supply the slurry to the polishing unit 10, and thus, the polishing machining is started with respect to the wafer W.

When the slurry supplying device 30 starts to supply the slurry to the polishing unit 10, the measuring machine 40 starts to measure the distribution and/or size distribution of the polishing particles contained in the slurry, and thus, the measurement results are sequentially given to the CMP controller 50.

When the CMP controller 50 receives the measurement result from the measuring machine 40, it compares the measurement result with the set value of the distribution of the polishing particles and/or the size distribution of the polishing particles as the basis for the initial set information. If the measured distribution of the polishing particles and/or the measured size distribution of the polishing particles is greater than the set value, the polishing speed with respect to the wafer W becomes high. Consequently, the control routine proceeds from step S2 to step S3, the CMP controller 50 outputs a control signal to the driver 20 in such a manner as to decrease the polishing speed with respect to the wafer W. Specifically, the CMP controller 50 sends, to the driver 20, a control signal to decrease the rotation speed of the polishing surface plate 11 and/or a control signal to decrease the rotation speed of the polishing head 12 and/or a control signal to decrease the pressurizing force of the polishing head 12. In this way, since the rotation speed of the polishing surface plate 11 or the polishing head 12 is decreased or the pressurizing force of the polishing head 12 is decreased in response to the drive signal sent from the driver 20, it is possible to prevent any situation in which the polishing speed with respect to the wafer W becomes high caused by an increase in distribution of the polishing particles and/or size distribution of the polishing particles.

In contrast, if the measured distribution of the polishing particles and/or the measured size distribution of the polishing particles is smaller than the set value, the polishing speed with respect to the wafer W becomes low. Consequently, the control routine proceeds from step S4 to step S5, the CMP controller 50 outputs a control signal to the driver 20 in such a manner as to increase the polishing speed with respect to the wafer W. Specifically, the CMP controller 50 sends, to the driver 20, a control signal to increase the rotation speed of the polishing surface plate 11 and/or a control signal to increase the rotation speed of the polishing head 12 and/or a control signal to increase the pressurizing force of the polishing head 12. In this way, since the rotation speed of the polishing surface plate 11 or the polishing head 12 is increased or the pressurizing force of the polishing head 12 is increased in response to the drive signal sent from the driver 20, it is possible to prevent any situation in which the polishing speed with respect to the wafer W becomes low caused by a decrease in distribution of the polishing particles and/or size distribution of the polishing particles.

Thereafter, the above-described processing is repeated until the polishing time included in the initial set information expires. As a result, the polishing speed with respect to the wafer W can be kept to be constant in the above-described chemical mechanical polishing apparatus even if the distribution or size distribution of the polishing particles contained in the slurry to be supplied to the polishing unit 10 is varied, and thus, it is possible to enhance the quality of the machining such as the uniformity or flatness of the polishing machining.

Here, the polishing speed which should be kept to be constant in the above-described polishing machining is varied according to the type or quality of the surface film of the wafer W as the object to be polished in the case of the same type of the surface film of the wafer W. For example, if the type of the surface film of the wafer W is BPTEOS (Boro Phospho Tetra Etyle Ortho Silicate), the optimum polishing speed is 100 Å/min.; in the meantime, the type of the surface film of the wafer W is W, the optimum polishing speed may be 150 Å/min. Moreover, when the type of the surface film is BPTEOS in the same manner, the optimum polishing speed is 110 Å/min. if the B concentration is high; in the meantime, the optimum polishing speed may be 120 Å/min. if the B concentration is low. In this manner, it is preferable that the optimum polishing speed should be previously set according to the type or quality of the surface film of the wafer W so as to control the polishing speed to allow it to accord with the optimum polishing speed all the time during the polishing machining.

Incidentally, since in the above-described first embodiment, the measurement result of the measuring machine 40 is output to the CMP controller 50, which then sends the control signal to the driver 20 so as to control the polishing speed, the constant polishing speed can be maintained even if the distribution or size distribution of the polishing particles contained in the slurry fabricated in the same lot by the same manufacturer is varied. However, the CMP controller 50 may be omitted. For example, there may be provided a display for displaying the measurement result of the measuring machine 40 and an input device for inputting a command value with respect to the driver 20, in which the input device may directly input the rotation speed of the polishing surface plate 11 and/or the rotation speed of the polishing head 12 and/or the pressurizing force of the polishing head 12 in such a manner as to achieve the optimum polishing speed according to the distribution or size distribution of the polishing particles contained in the slurry based on the measurement result displayed on the display when a slurry manufacturer or a fabrication lot is changed.

Next, a description will be given of a second embodiment of the present invention. In the above-described first embodiment, the physical quantity (the rotation speed of the polishing surface plate 11 and/or the rotation speed of the polishing head 12 and/or the pressurizing force of the polishing head 12) as the determinant factor of the polishing speed with respect to the wafer W is controlled based on the measurement result of the measuring machine 40, thereby enhancing the quality of the machining such as the uniformity or flatness of the polishing machining. In contrast, in the second embodiment, a polishing time is controlled based on the measurement result of the measuring machine 40.

Figure 3:
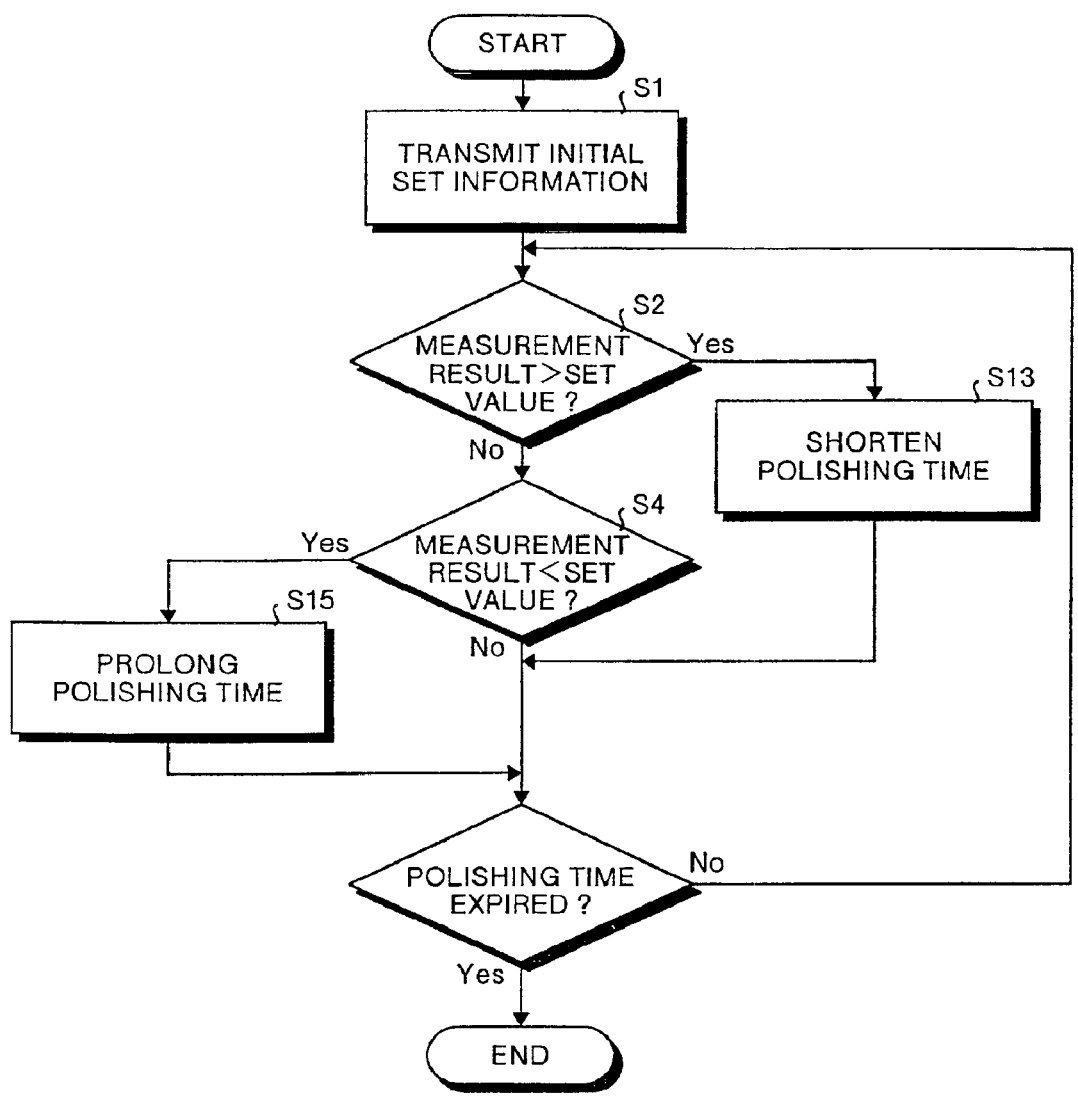
FIG. 3 is a flowchart illustrating the procedures of processing which is implemented by a CMP controller in a chemical mechanical polishing apparatus in a second preferred embodiment according to the present invention.

FIG. 3 is a flowchart illustrating the procedures of processing which is implemented by a CMP controller 50 in a chemical mechanical polishing apparatus in the second embodiment according to the present invention. Referring to FIG. 3, explanation will be give below about the operation of the chemical mechanical polishing apparatus. Here, the configuration of the chemical mechanical polishing apparatus is identical to that in the first embodiment illustrated in FIG. 1, with the exception that a CMP controller 50 previously stores an optimum polishing time according to the distribution or size distribution of polishing particles in the chemical mechanical polishing apparatus in the second embodiment.

First, the CMP controller 50, which has transmitted initial set information in step S1, receives the measurement results of the distribution and/or size distribution of polishing particles in a slurry, measured by a measuring machine 40 during polishing machining with respect to a wafer W.

When the CMP controller 50 receives the measurement result from the measuring machine 40, it compares the measurement result with the set value of the distribution of the polishing particles and/or the size distribution of the polishing particles as the basis for the initial set information. If the measured distribution of the polishing particles and/or the measured size distribution of the polishing particles is greater than the set value, the polishing speed with respect to the wafer W becomes high. Consequently, the control routine proceeds from step S2 to step S3, the CMP controller 50 outputs a control signal to a driver 20 in such a manner as to shorten the polishing time with respect to the wafer W.

In contrast, if the measured distribution of the polishing particles and/or the measured size distribution of the polishing particles is smaller than the set value, the polishing speed with respect to the wafer W becomes low. Consequently, the control routine proceeds from step S4 to step S5, the CMP controller 50 outputs a control signal to the driver 20 in such a manner as to prolong the polishing time with respect to the wafer W.

Thereafter, the above-described processing is repeated until the polishing time expires. As a result, the polishing time with respect to the wafer W is controlled to become optimum all the time according to the variations in the distribution or size distribution of the polishing particles contained in the slurry to be supplied to the polishing unit 10 in the above-described chemical mechanical polishing apparatus, thus enhancing the quality of the machining such as the uniformity or flatness of the polishing machining. In this case, the shortened polishing time can produce the effect of reducing a use quantity of the slurry in the polishing machining.

Figure 4:
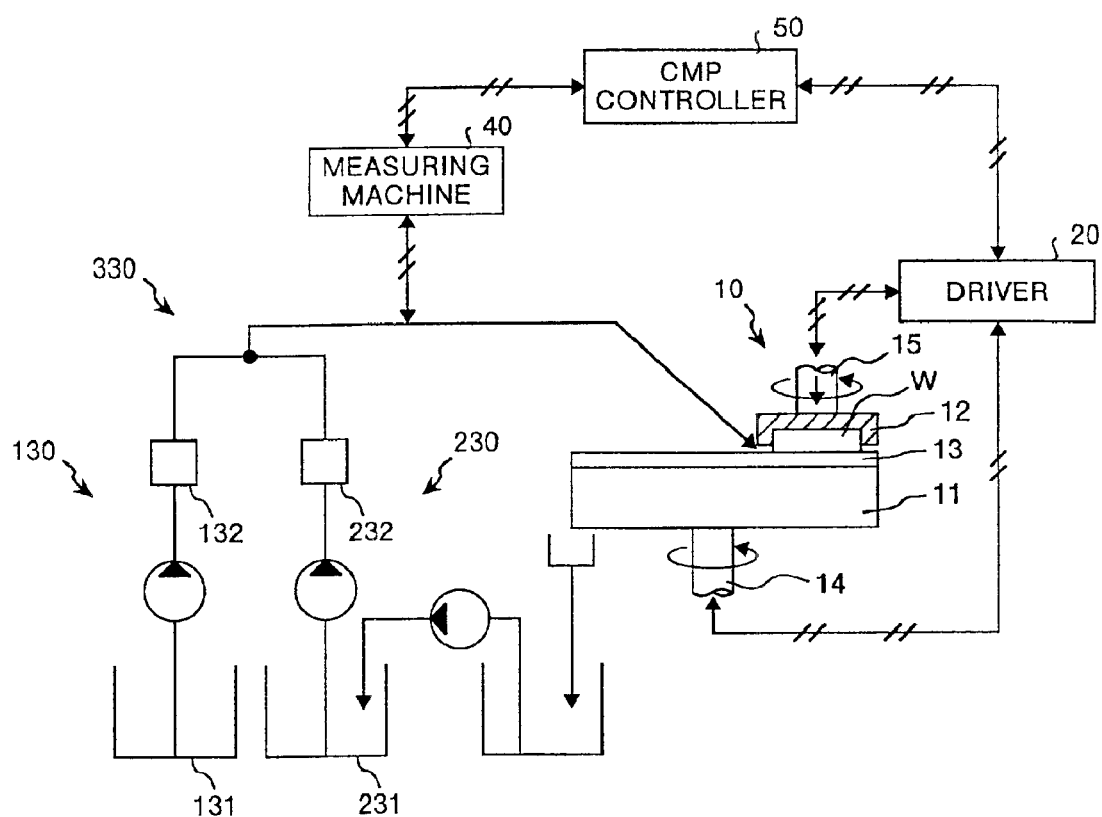
FIG. 4 is a block diagram illustrating the configuration of a chemical mechanical polishing apparatus in a third preferred embodiment according to the present invention.

FIG. 4 is a block diagram illustrating the configuration of a chemical mechanical polishing apparatus in a third embodiment of the present invention. The chemical mechanical polishing apparatus illustrated herein is different in the configuration for supplying a slurry to a polishing unit 10 from that in the first embodiment illustrated in FIG. 1.

That is, the chemical mechanical polishing apparatus in the third embodiment comprises a first slurry supplying device 130 for supplying a slurry from a first tank 131, a second slurry supplying device 230 for supplying a slurry from a second tank 231 and a mixture slurry supplying device 330 for mixing the slurry supplied from the first tank 131 with the slurry supplied from the second tank 231 so as to supply the mixture slurry to the polishing unit 10. The first tank 131 reserves therein a non-used fresh slurry; in contrast, the second tank 231 reserves therein the recovered slurry for recycling after the slurry has been supplied to the polishing unit 10. A mixture ratio of the fresh slurry to the recovered slurry is set by appropriately adjusting flow rate control valves 132 and 232 disposed in the slurry supplying devices 130 and 230, respectively, in such a manner as to achieve optimum polishing machining. A measuring machine 40 for measuring the distribution or size distribution of polishing particles contained in the slurry is disposed on the way of the mixture slurry supplying device 330. Here, the same component parts as those in the chemical mechanical polishing apparatus in the first embodiment illustrated in FIG. 1 are designated by the same reference numerals, and therefore, the detailed description thereof will be omitted below. Furthermore, the processing content of a CMP controller 50 based on the measurement result from the measuring machine 40 is identical to that in the first embodiment illustrated in FIG. 2 or the second embodiment illustrated in FIG. 3, and therefore, the description relating to the operation will be omitted below.

In the chemical mechanical polishing apparatus such configured as described above, a polishing speed or a polishing time is controlled according to the distribution or size distribution of the polishing particles contained in the mixture slurry to be supplied to the polishing unit 10 even when the recovered slurry which has been once used for polishing is recycled, thereby enhancing the machining quality such as the uniformity or flatness of the polishing machining.

In the above-described third embodiment, the non-used fresh slurry is supplied from the first slurry supplying device 130, and in contrast, the recovered slurry for recycling is supplied from the second slurry supplying device 230. However, for example, a non-used fresh slurry fabricated by another manufacturer may be supplied from the second slurry supplying device 230, or a non-used fresh slurry fabricated in a different lot by the same manufacturer may be supplied. In either case, since the polishing speed or the polishing time is controlled according to the distribution or size distribution of the polishing particles contained in the mixture slurry, the same function and effect can be expected.

Figure 5:
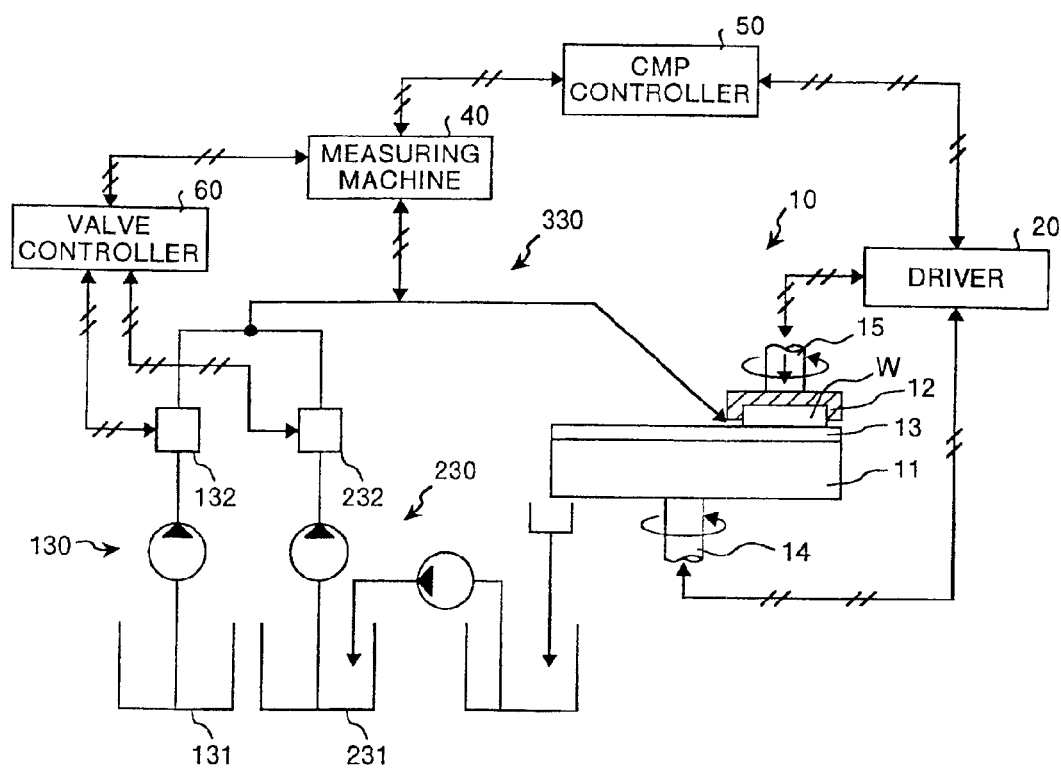
FIG. 5 is a block diagram illustrating the configuration of a chemical mechanical polishing apparatus in a fourth preferred embodiment according to the present invention.

FIG. 5 is a block diagram illustrating the configuration of a chemical mechanical polishing apparatus in a fourth preferred embodiment according to the present invention. The chemical mechanical polishing apparatus illustrated herein is different in the configuration for supplying a slurry to a polishing unit 10 from that in the first embodiment illustrated in FIG. 1.

That is, the chemical mechanical polishing apparatus in the fourth embodiment comprises a first slurry supplying device 130 for supplying a slurry from a first tank 131, a second slurry supplying device 230 for supplying a slurry from a second tank 231 and a mixture slurry supplying device 330 for mixing the slurry supplied from the first tank 131 with the slurry supplied from the second tank 231 so as to supply the mixture slurry to the polishing unit 10. The first tank 131 reserves therein a non-used fresh slurry; in contrast, the second tank 231 reserves therein the recovered slurry for recycling after the slurry has been supplied to the polishing unit 10. On the way of the first slurry supplying device 130 and the second slurry supplying device 230 are disposed flow rate control valves 132 and 232, respectively. Each of the flow rate control valves 132 and 232 is operated in response to a control signal output from a valve controller 60, to thus adjust a quantity of the slurry to be supplied from each of the first slurry supplying device 130 and the second slurry supplying device 230 to the mixture slurry supplying device 330. A measuring machine 40 is provided on the way of the mixture slurry supplying device 330, for measuring the distribution and/or size distribution of polishing particles contained in the passing mixture slurry, and then, sending the measurement result to a CMP controller 50 and the valve controller 60. Here, the same component parts as those in the chemical mechanical polishing apparatus in the first embodiment illustrated in FIG. 1 are designated by the same reference numerals, and therefore, the detailed description thereof will be omitted below. Furthermore, the processing content of the CMP controller 50 based on the measurement result from the measuring machine 40 is identical to that in the first embodiment illustrated in FIG. 2 or the second embodiment illustrated in FIG. 3, and therefore, the description relating to the operation will be omitted below.

FIG. 6 is a flowchart illustrating the control content which is implemented during polishing machining by the above-described valve controller 60. Referring to FIG. 6, explanation will be made below on the operation in which the slurry is supplied to the polishing unit 10.

First, the valve controller 60 initializes the flow rate control valves 132 and 232 (in step S21). This initialization is performed in order to adjust the flow rate control valve 132 of the first slurry supplying device 130 and the flow rate control valve 232 of the second slurry supplying device 230 in such a manner that the mixture slurry passing through the mixture slurry supplying device 330 has the distribution and/or size distribution of polishing particles with which optimum polishing can be achieved in the polishing unit 10.

After the initialization, the valve controller 60 waits for the measurement result from the measuring machine 40. In the meantime, when the mixture slurry supplying device 330 starts to supply the mixture slurry to the polishing unit 10, the measuring machine 40 starts to measure the distribution and/or size distribution of the polishing particles in the mixture slurry, and then, gives the measurement results in sequence to the CMP controller 50 and the valve controller 60.

Figure 7A:
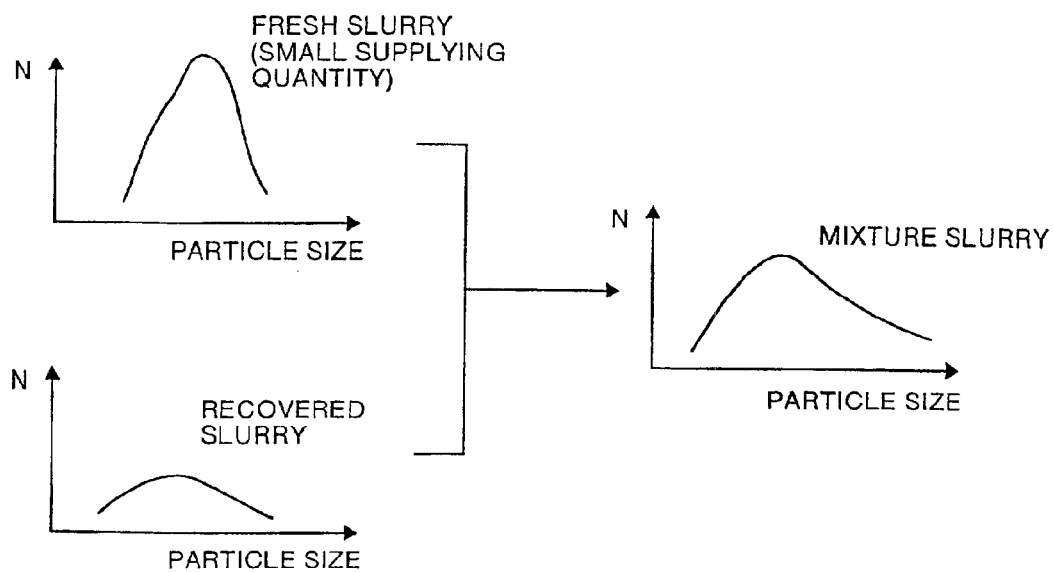
FIG. 7A and FIG. 7B are graphs illustrating the differences in distribution or size distribution of polishing particles contained in a mixture slurry when the mixture ratio of a fresh slurry to a recovered slurry is varied.

Upon receipt of the measurement result from the measuring machine 40, the valve controller 60 compares the measurement result with the set value of the distribution and/or size distribution of the polishing particles as the basis for the initialization. If the measured distribution and/or size distribution of the polishing particles is greater than the set value, the control routine proceeds from step S22 to step S23, in which the valve controller 60 outputs a control signal to each of the flow rate control valves 132 and 232 in such a manner as to reduce the distribution and/or size distribution of the polishing particles. Specifically, the valve controller 60 transmits the control signal to each of the flow rate control valves 132 and 232 in such a manner as to decrease the opening degree of the flow rate control valve 132 disposed in the first slurry supplying device 130 while to increase the opening degree of the flow rate control valve 232 disposed in the second slurry supplying device 230. That is to say, as shown in FIG. 7A, since it is general that the recovered slurry for recycling is smaller in distribution and size distribution of the polishing particles than a non-used fresh slurry, the recovered slurry is mixed in greater quantity into the fresh slurry, thereby reducing the distribution and/or size distribution of the polishing particles in the mixture slurry, and in other words, equalizing it to the above-described set value.

Figure 7B:
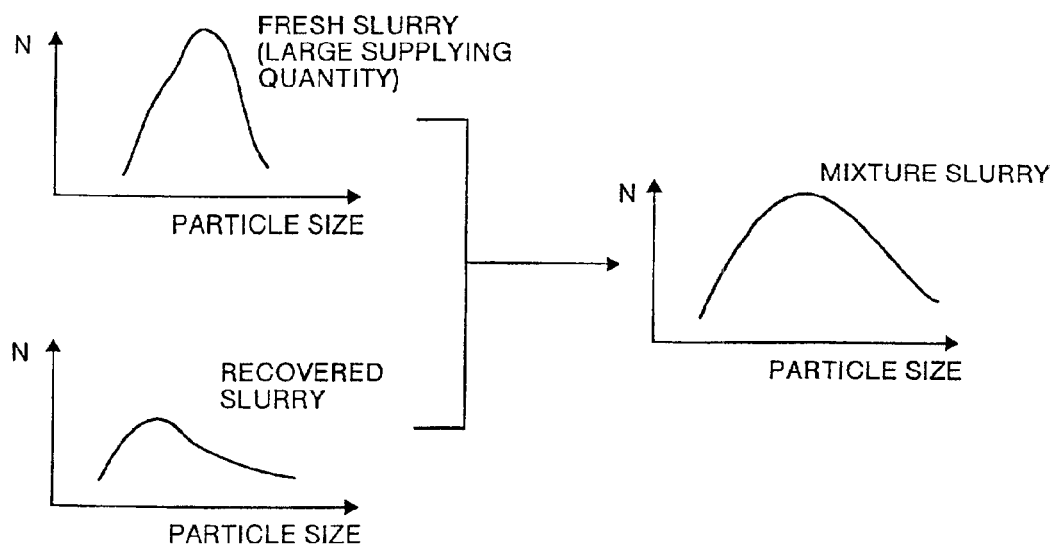

In contrast, if the measured distribution and/or size distribution of the polishing particles is smaller than the set value, the control routine proceeds from step S24 to step S25, in which the valve controller 60 outputs a control signal to each of the flow rate control valves 132 and 232 in such a manner as to reduce the distribution and/or size distribution of the polishing particles. Specifically, the valve controller 60 transmits the control signal to each of the flow rate control valves 132 and 232 in such a manner as to increase the opening degree of the flow rate control valve 132 disposed in the first slurry supplying device 130 while to decrease the opening degree of the flow rate control valve 232 disposed in the second slurry supplying device 230. That is to say, as shown in FIG. 7B, the fresh slurry is mixed in greater quantity into the recovered slurry, thereby increasing the distribution and/or size distribution of the polishing particles in the mixture slurry, and in other words, equalizing it to the above-described set value.

Thereafter, the above-described processing is repeated until the polishing machining is completed in the polishing unit 10. As a result, the mixture slurry having the constant distribution and/or size distribution of the polishing particles can be supplied from the mixture slurry supplying device 330 to the polishing unit 10 in the above-described chemical mechanical polishing apparatus. Therefore, it is possible to prevent any situation in which the distribution or size distribution of the polishing particles contained in the slurry to be supplied to the polishing unit 10 is markedly varied, and further, to enhance the quality of the machining such as the uniformity or flatness of the polishing machining. Moreover, in the chemical mechanical polishing apparatus in which the mixture slurry is supplied to the polishing unit 10, it is possible to produce the effect of dispensing with a cumbersome control of the rotation speed of the polishing surface plate 11 and/or the rotation speed of the polishing head 12 and/or the pressurizing force of the polishing head 12.

Here, the distribution and/or size distribution of the polishing particles contained in the slurry which should be kept to be constant in the above-described polishing machining is varied according to the type or quality of the surface film of the wafer W as the object to be polished in the case of the same type of the surface film of the wafer W. For example, if the type of the surface film of the wafer W is BPTEOS, the optimum distribution and/or size distribution of the polishing particles contained in the slurry is as small as about 0.2 $\mu$m; in the meantime, the type of the surface film of the wafer W is W, the optimum distribution and/or size distribution of the polishing particles contained in the slurry may largely exceed 0.2 $\mu$m. Moreover, when the type of the surface film is BPTEOS in the same manner, the optimum distribution and/or size distribution of the polishing particles contained in the slurry at a high B concentration may be different from that at a low B concentration. Therefore, it is preferable that the optimum distribution and/or size distribution of the polishing particles contained in the slurry should be previously set according to the type or quality of the surface film of the wafer W so as to control to optimize the distribution and/or size distribution of the polishing particles contained in the slurry all the time during the polishing machining by, for example, controlling a mixture ratio or selecting a manufacturer.

Incidentally, in the above-described fourth embodiment, the non-used fresh slurry is supplied from the first slurry supplying device 130, and in contrast, the recovered slurry for recycling is supplied from the second slurry supplying device 230. However, for example, a non-used fresh slurry, which is available from another manufacturer, may be supplied from the second slurry supplying device 230, or a non-used fresh slurry fabricated in another lot by the same manufacturer may be supplied from the second slurry supplying device 230. Since the mixture ratio of the slurry to be supplied from the first slurry supplying device 130 to the slurry to be supplied from the second slurry supplying device 230 is controlled according to the distribution or size distribution of the polishing particles contained in the mixture slurry in either case, a similar function and effect can be expected. Additionally, the mixture slurry to be supplied to the polishing unit 10 does not always contain both of the first and second slurries in mixture, and may contain either one thereof.

Figure 8:
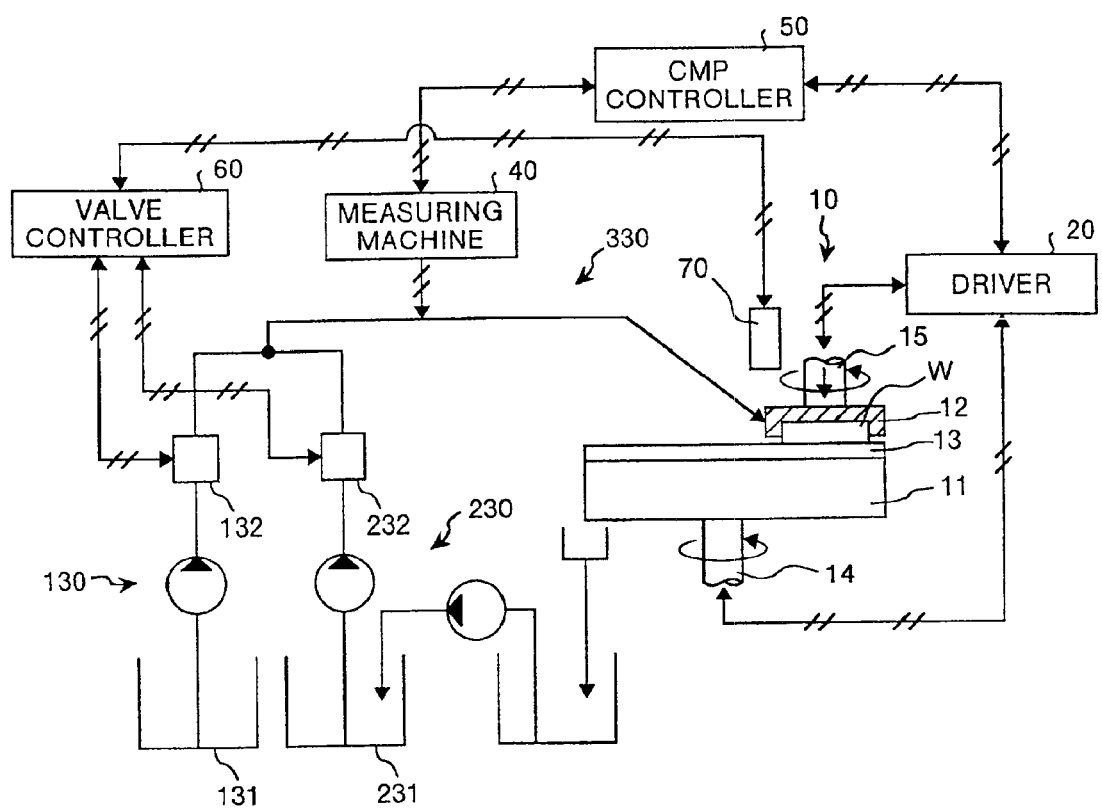
FIG. 8 is a block diagram illustrating the configuration of a chemical mechanical polishing apparatus in a fifth preferred embodiment according to the present invention.

FIG. 8 is a block diagram illustrating the configuration of a chemical mechanical polishing apparatus in a fifth preferred embodiment according to the present invention. The chemical mechanical polishing apparatus illustrated herein is different in the configuration for supplying a slurry to a polishing unit 10 from that in the first embodiment illustrated in FIG. 1.

That is, the chemical mechanical polishing apparatus in the fifth embodiment comprises a first slurry supplying device 130 for supplying a slurry from a first tank 131, a second slurry supplying device 230 for supplying a slurry from a second tank 231 and a mixture slurry supplying device 330 for mixing the slurry supplied from the first tank 131 with the slurry supplied from the second tank 231 so as to supply the mixture slurry to the polishing unit 10. The first tank 131 reserves therein a non-used fresh slurry; in contrast, the second tank 231 reserves therein the recovered slurry for recycling after the slurry has been supplied to the polishing unit 10. On the way of the first slurry supplying device 130 and the second slurry supplying device 230 are disposed flow rate control valves 132 and 232, respectively. Each of the flow rate control valves 132 and 232 is operated in response to a control signal output from a valve controller 60, to thus adjust a quantity of the slurry to be supplied from each of the first slurry supplying device 130 and the second slurry supplying device 230 to the mixture slurry supplying device 330. A measuring machine 40 is provided on the way of the mixture slurry supplying device 330, for measuring the distribution and/or size distribution of polishing particles contained in the passing mixture slurry, and then, sending the measurement result to a CMP controller 50.

Furthermore, the above-described chemical mechanical polishing apparatus is provided with a speed monitor 70 in the polishing unit 10. The speed monitor 70 actually measures a polishing speed with respect to a wafer W during polishing, and then, gives the measurement result to the above-described valve controller 60. Here, the same component parts as those in the chemical mechanical polishing apparatus in the first embodiment illustrated in FIG. 1 are designated by the same reference numerals, and therefore, the detailed description thereof will be omitted below.

Figure 9:
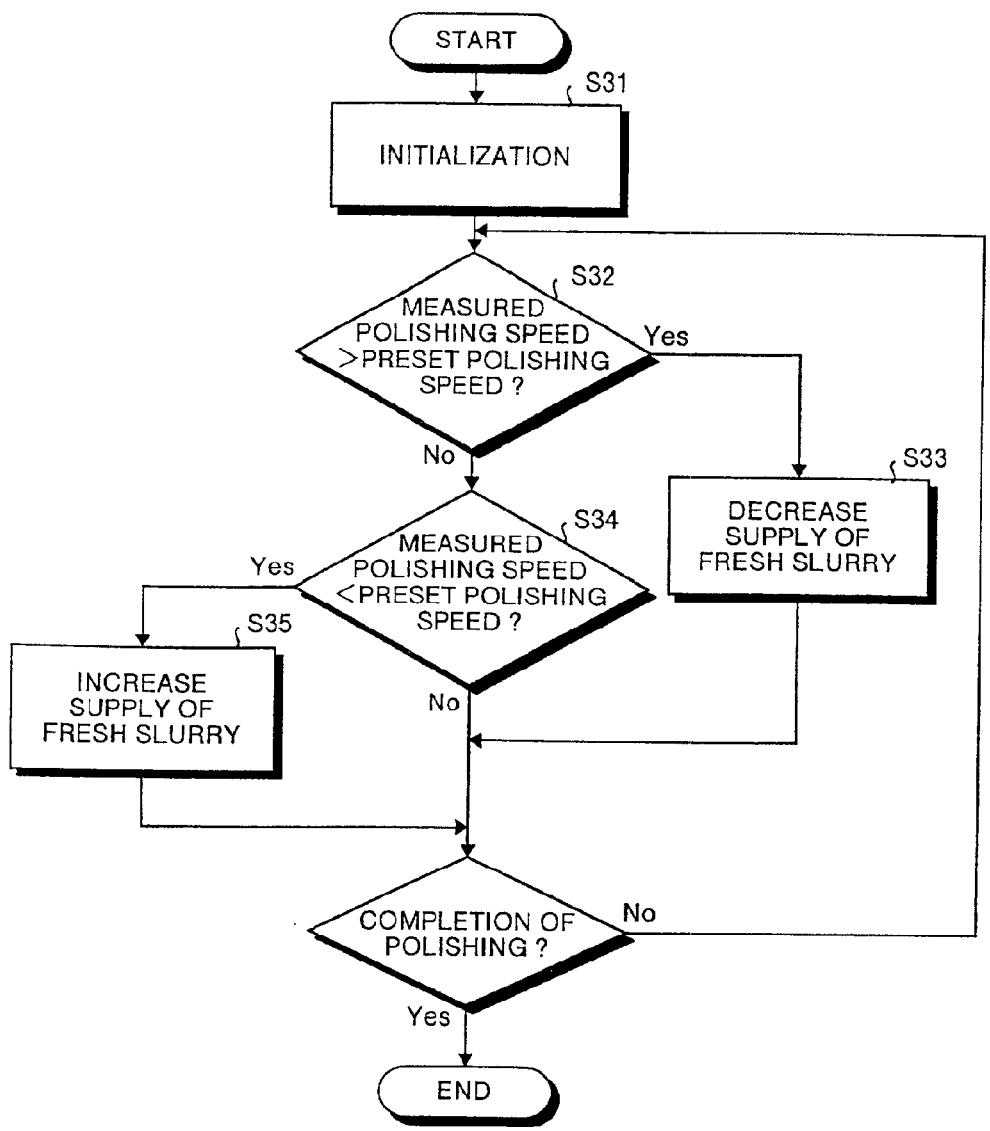
FIG. 9 is a flowchart illustrating the control content which is implemented by a valve controller during polishing machining in the fifth preferred embodiment.
Figure 10A:
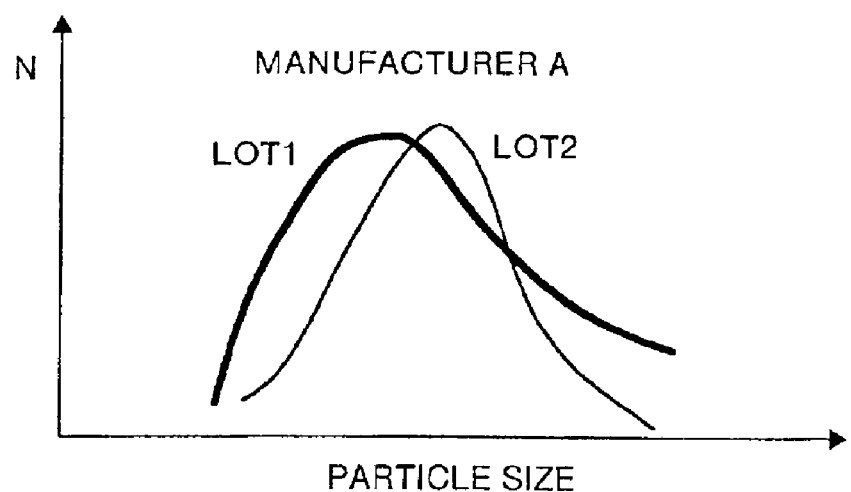
FIG. 10A and FIG. 10B are graphs illustrating the state in which the distribution or size distribution of polishing particles contained in a slurry is varied depending upon manufacturers or fabrication lots.
Figure 10B:
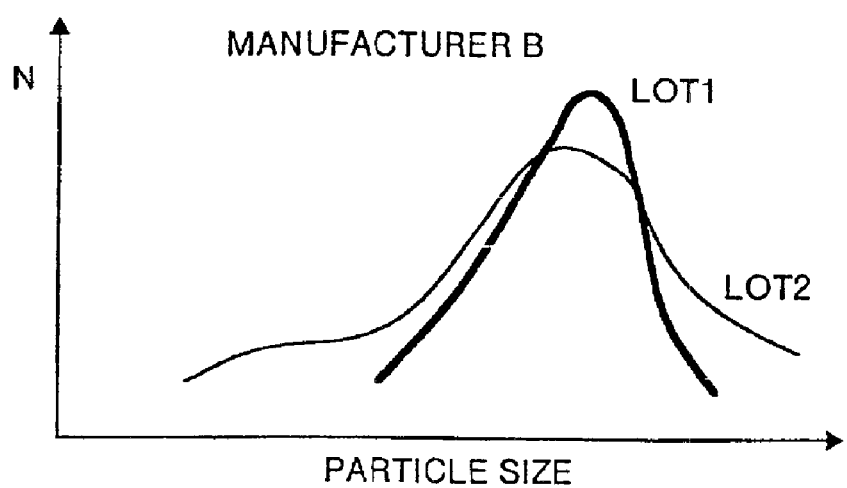

FIG. 9 is a flowchart illustrating the control content which is implemented by the above-described valve controller 60 during polishing machining. Referring to FIG. 9, explanation will be made below on the operation in which the slurry is supplied to the polishing unit 10.

First, the valve controller 60 initializes the flow rate control valves 132 and 232 (in step S31). This initialization is performed in order to adjust the flow rate control valve 132 of the first slurry supplying device 130 and the flow rate control valve 232 of the second slurry supplying device 230 in such a manner that the mixture slurry passing through the mixture slurry supplying device 330 has the distribution and/or size distribution of polishing particles with which optimum polishing can be achieved at a preset polishing speed in the polishing unit 10.

After the initialization, the valve controller 60 waits for the measurement result from the speed monitor 70. In the meantime, when the mixture slurry supplying device 330 starts to supply the mixture slurry to the polishing unit 10 to thus start the polishing with respect to the wafer W, the speed monitor 70 starts to measure the polishing speed with respect to the wafer W, and then, gives the measurement results in sequence to the valve controller 60.

Upon receipt of the measurement result from the speed monitor 70, the valve controller 60 compares the measured polishing speed with the preset polishing speed as the basis for the initialization. If the measured polishing speed is higher than the preset polishing speed, the control routine proceeds from step S32 to step S33, in which the valve controller 60 outputs a control signal to each of the flow rate control valves 132 and 232 in such a manner as to reduce the polishing speed. Specifically, the valve controller 60 transmits the control signal to each of the flow rate control valves 132 and 232 in such a manner as to decrease the opening degree of the flow rate control valve 132 disposed in the first slurry supplying device 130 while to increase the opening degree of the flow rate control valve 232 disposed in the second slurry supplying device 230. That is to say, since are covered slurry for recycling is generally smaller in distribution and size distribution of the polishing particles than a non-used fresh slurry, the distribution and/or size distribution of the polishing particles in the mixture slurry is reduced by mixing the recovered slurry in greater quantity into the fresh slurry, thereby reducing the polishing speed with respect to the wafer W.

In contrast, if the measured polishing speed is lower than the preset polishing speed, the control routine proceeds from step S34 to step S35, in which the valve controller 60 outputs a control signal to each of the flow rate control valves 132 and 232 in such a manner as to reduce the polishing speed. Specifically, the valve controller 60 transmits the control signal to each of the flow rate control valves 132 and 232 in such a manner as to increase the opening degree of the flow rate control valve 132 disposed in the first slurry supplying device 130 while to decrease the opening degree of the flow rate control valve 232 disposed in the second slurry supplying device 230. That is to say, the distribution and/or size distribution of the polishing particles in the mixture slurry is increased by mixing the recovered slurry in greater quantity into the fresh slurry, thereby increasing the polishing speed with respect to the wafer W.

Thereafter, the above-described processing is repeated until the polishing machining is completed in the polishing unit 10. As a result, in the above-described chemical mechanical polishing apparatus, the valve controller 60 appropriately varies the mixing ratio of the fresh slurry to the recovered slurry according to the polishing speed with respect to the wafer W, thereby keeping the polishing speed with respect to the wafer W constant. Therefore, it is possible to enhance the quality of the machining such as the uniformity or flatness of the polishing machining.

Incidentally, in the above-described fifth embodiment, the non-used fresh slurry is supplied from the first slurry supplying device 130, and in contrast, the recovered slurry for recycling is supplied from the second slurry supplying device 230. However, for example, a non-used fresh slurry, which is available from an other manufacturer, maybe supplied from the second slurry supplying device 230, or a non-used fresh slurry fabricated in another lot by the same manufacturer maybe supplied from the second slurry supplying device 230. Since the valve controller 60 appropriately varies the mixing ratio of the first slurry to the second slurry according to the polishing speed with respect to the wafer W in either case, the polishing speed with respect to the wafer W can be kept to be constant. Therefore, a similar function and effect can be expected. Additionally, in the above-described fifth embodiment, the CMP controller 50 need not control the rotation speed of the polishing surface plate 11 and/or the rotation speed of the polishing head 12 and/or the pressurizing force of the polishing head 12, and therefore, the CMP controller 50 or the measuring machine 40 may be eliminated. The rotation speed of the polishing surface plate 11 and/or the rotation speed of the polishing head 12 and/or the pressurizing force of the polishing head 12 may be controlled at the same time in addition to the control of the valve controller 60, like in the first embodiment.

Incidentally, although in each of the above-described first to fifth embodiments, the wafer W exemplifies the object to be polished, the present invention is, of course, applicable even if other objects are to be polished.

As described above, according to the present invention, the polishing speed with respect to the object to be polished can be controlled based on the information on the polishing particles contained in the slurry, such as the distribution of the polishing particles or the size distribution of the polishing particles. Consequently, the polishing speed with respect to the object to be polished can be kept to be constant even if the distribution of the polishing particles or the size distribution of the polishing particles is varied, thus producing the effect of enhancing the machining quality such as the uniformity or flatness of the polishing machining.

Moreover, the polishing machining can be performed at the polishing speed optimum to the type or quality of the surface film of the object to be polished. Consequently, even if the object to be polished is different in type or quality of the surface film, it is possible to produce the effect of enhancing the machining quality such as the uniformity or flatness of the polishing machining.

Furthermore, the polishing time can be controlled based on the information on the polishing particles contained in the slurry, such as the distribution of the polishing particles or the size distribution of the polishing particles. Consequently, the polishing quantity with respect to the object to be polished can be kept to be constant even if the distribution of the polishing particles or the size distribution of the polishing particles is varied, thus producing the effect of enhancing the machining quality such as the uniformity or flatness of the polishing machining.

Moreover, it is possible to control the supplying rates of the first slurry and the second slurry based on the polishing speed with respect to the object to be polished. Consequently, the polishing speed with respect to the object to be polished can be kept to be constant by appropriately varying the supplying rates of the first and second slurries, thus producing the effect of enhancing the machining quality such as the uniformity or flatness of the polishing machining.

Furthermore, it is possible to control the supplying rates of the first slurry and the second slurry according to the type or quality of the surface film of the object to be polished. Consequently, the polishing speed with respect to the object to be polished can be kept to be constant by appropriately varying the supplying rates of the first and second slurries, thus producing the effect of enhancing the machining quality such as the uniformity or flatness of the polishing machining.

Moreover, the polishing speed with respect to the object to be polished can be controlled based on the information on the polishing particles contained in the slurry, such as the distribution of the polishing particles or the size distribution of the polishing particles. Consequently, the polishing speed with respect to the object to be polished can be kept to be constant even if the distribution of the polishing particles or the size distribution of the polishing particles is varied, thus producing the effect of enhancing the machining quality such as the uniformity or flatness of the polishing machining.

Furthermore, the polishing time can be controlled based on the information on the polishing particles contained in the slurry, such as the distribution of the polishing particles or the size distribution of the polishing particles. Consequently, the polishing quantity with respect to the object to be polished can be kept to be constant even if the distribution of the polishing particles or the size distribution of the polishing particles is varied, thus producing the effect of enhancing the machining quality such as the uniformity or flatness of the polishing machining.

Moreover, it is possible to mix the first slurry supplied from the first slurry supplying unit with the second slurry supplied from the second slurry supplying unit, so as to supply the mixture slurry to the polishing unit. Consequently, it is possible to supply, for example, the non-used fresh slurry and the recovered slurry for recycling in combination or different slurries fabricated by different manufacturers in combination.

Furthermore, the mixture ratio of the first slurry to the second slurry can be controlled based on the information on the polishing particles contained in the slurry, such as the distribution of the polishing particles or the size distribution of the polishing particles. Consequently, it is possible to suppress the variations in distribution or size distribution of the polishing particles contained in the mixture slurry to be supplied to the polishing unit.

Moreover, it is possible to control the mixture ratio of the first slurry to the second slurry based on the polishing speed with respect to the object to be polished. Consequently, the polishing speed with respect to the object to be polished can be kept to be constant by appropriately varying the mixing ratio of the first and second slurries, thus producing the effect of enhancing the machining quality such as the uniformity or flatness of the polishing machining.

Furthermore, it is possible to control the mixture ratio of the first slurry to the second slurry based on the information on the polishing particles contained in the slurry, such as the distribution of the polishing particles or the size distribution of the polishing particles, thus controlling the mixture ratio of the slurries to be supplied to the polishing unit in the chemical mechanical polishing apparatus. Consequently, it is possible to suppress the variations in distribution or size distribution of the polishing particles contained in the mixture slurry to be supplied to the polishing unit, thus producing the effect of enhancing the machining quality such as the uniformity or flatness of the polishing machining performed in the chemical mechanical polishing apparatus.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of chemical mechanical polishing comprising:

supplying a slurry including polishing particles to a polishing apparatus including a polisher and an object to be polished;

measuring particle information, including at least one of dispersion of the polishing particles and distribution of particle sizes of the polishing particles, of the slurry that is directly supplied to the object in the polishing apparatus; and controlling polishing speed at which the object is being polished, based on the particle information by adjusting at least one of rotation speed of the polisher, rotation speed of the object, and force applied by the polisher to the object.

2. The method according to claim 1 including supplying a mixture of a first slurry and a second slurry to the polishing apparatus as the slurry directly supplied to the object.

3. The method according to claim 2 including controlling mixing ratio between the first slurry and the second slurry based on the particle information.

4. The method according to claim 3, further comprising: detecting the polishing speed at which the object is being polished; and controlling the mixing ratio based on the polishing speed.

* * * * *